(12) United States Patent
Park

(10) Patent No.: US 9,166,013 B2
(45) Date of Patent: Oct. 20, 2015

(54) NONVOLATILE MEMORY DEVICE AND METHOD FOR FABRICATING THE SAME

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 26 days.

(21) Appl. No.: 14/020,645

(22) Filed: Sep. 6, 2013

(65) Prior Publication Data
US 2014/0312410 A1    Oct. 23, 2014

(30) Foreign Application Priority Data

Apr. 18, 2013  (KR) .......................... 10-2013-0042908

(51) Int. Cl.
*H01L 29/792*   (2006.01)
*H01L 29/423*   (2006.01)
*H01L 27/115*   (2006.01)
*H01L 21/28*   (2006.01)

(52) U.S. Cl.
CPC ...... *H01L 29/4234* (2013.01); *H01L 21/28282* (2013.01); *H01L 27/11573* (2013.01); *H01L 29/7923* (2013.01); *H01L 21/28273* (2013.01); *H01L 27/115* (2013.01); *H01L 27/11521* (2013.01)

(58) Field of Classification Search
CPC ..................... H01L 29/4234; H01L 27/11573; H01L 21/28282; H01L 29/7923; H01L 27/115; H01L 27/11568; H01L 29/42352; H01L 29/66833
USPC ............... 257/325, 324, 314, 315, E21.18, 257/E21.422, E21.433; 438/216, 261, 591, 438/593
See application file for complete search history.

(56) References Cited

U.S. PATENT DOCUMENTS 7,309,634 B2 * 12/2007 Hong ........................ 438/288
7,342,280 B2    3/2008 Yoo
8,035,157 B2   10/2011 Lee

* cited by examiner

*Primary Examiner* — Thinh T Nguyen
(74) *Attorney, Agent, or Firm* — IP &T Group LLP

(57) ABSTRACT

A nonvolatile memory device having a plurality of unit cells, each of the plurality of unit cells includes a first transistor suitable for having a fixed threshold voltage, and a second transistor suitable for coupling to the first transistor in parallel and having a variable threshold voltage.

16 Claims, 14 Drawing Sheets

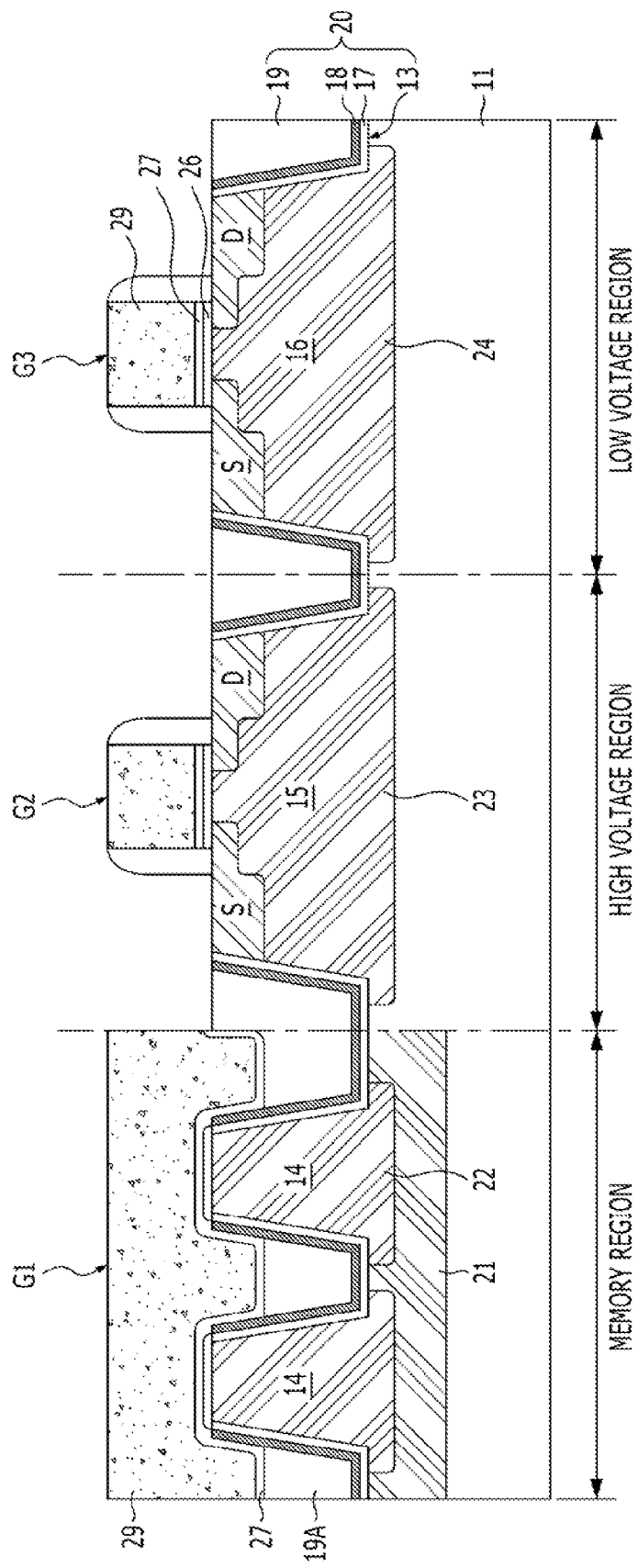

NONVOLATILE MEMORY DEVICE AND METHOD FOR FABRICATING THE SAME

CROSS-REFERENCE TO RELATED APPLICATIONS

The present invention claims priority of Korean patent application number 10-2013-0042908, filed on Apr. 18, 2013, which is incorporated by reference in its entirety.

BACKGROUND

1. Field

Exemplary embodiments of the present invention relate to a semiconductor manufacturing technology, and more particularly, to a nonvolatile memory device and a method for fabricating the same.

2. Description of the Related Art

As digital media devices advance, acquiring information becomes easy. Such digital media devices may need storage medium for storing an image, music and various data. Thus, a nonvolatile memory semiconductor has been focused on a system on chip (SOC) field according to a high integration, and major semiconductor companies have invested to reinforce the SOC technology. Especially, since the SOC represents that all system technologies are concentrated on a single semiconductor, if a system design technology is not acquired, it will be difficult to develop a nonvolatile memory semiconductor.

Meanwhile, an embedded memory is one of the most important fields in the SOC, and a flash memory is highlighted in the embedded memory field. The flash memory is classified into a floating gate type and a silicon-oxide-nitride-oxide-silicon (SONOS) type. Recently, a research and development for the SONOS type has been widely performed.

For reference, the flash memory of the SONOS type is a nonvolatile memory device, which uses a mechanism for trapping and de-trapping a charge on a trap site of a material layer (e.g., nitride layer).

FIG. 1 is a cross-sectional view illustrating a cell of a conventional nonvolatile memory device.

Referring to FIG. 1, a conventional nonvolatile memory device of SONOS type includes an isolation layer 102, an active region 103, a memory layer 107, a gate electrode 108, a gate 109, and a source region and a drain region 110.

The active region 103 is defined on the substrate 101 by the isolation layer 102. The gate 109 includes the memory layer 107 and the gate electrode 108, which are stacked on the substrate. The source region and the drain region 110 are formed on the substrate 101 under both sides of the gate 109. The memory layer 107 includes a tunnel insulating layer 104, a charge trapping layer 105 and a charge blocking layer 106, which are sequentially stacked.

Since the embedded memory is fabricated through a logic process, it may be preferable that the embedded memory is designed to exclude the addition of other processes except a predetermined logic process to prevent a characteristic deterioration that may be caused by a process variable. However, the conventional flash memory of SONOS type may need an additional process for forming the memory layer 107 to the logic process. Especially, since the memory layer 107 is used as a storage medium for storing data and needs a layer having a good quality, when a forming process of the memory layer 107 is performed, a heating stress may occur in a structure.

As a result, since the conventional nonvolatile memory forms the memory layer 107 through an additional process to the logic process, logic compatibility thereof may be lowered, and a characteristic thereof may be lowered.

SUMMARY

Exemplary embodiments of the present invention are directed to a nonvolatile memory device and a method for fabricating the same having excellent logic compatibility.

In accordance with an exemplary embodiment of the present invention, a nonvolatile memory device having a plurality of unit cells, each may include a first transistor configured to have a fixed threshold voltage, and a second transistor suitable for coupling to the first transistor in parallel and having a variable threshold voltage.

In accordance with another exemplary embodiment of the present invention, a nonvolatile memory device may include an isolation trench formed on a substrate and defining an active region, a charge trapping layer formed on a surface of the isolation trench, a gap-fill insulating layer partially filling the isolation trench on the charge trapping layer, a gate formed on the substrate and filling a remaining isolation trench on the gap-fill insulating layer, and a source and drain formed on the active region under both sides of the gate.

In accordance with yet another exemplary embodiment of the present invention, a nonvolatile memory device may include an isolation trench formed on a substrate and defining an active region, a memory layer formed on a surface of the isolation trench, a gap-fill insulating layer partially filling the isolation trench on the memory layer, a gate formed on the substrate and filling a remaining isolation trench on the gap-fill insulating layer, a second conductive type source and a second conductive type drain formed on the active region under both sides of the gate, and a first conductive type threshold voltage adjusting region formed on the active region between the second conductive type source and the second conductive type drain.

In accordance with yet another exemplary embodiment of the present invention, a method for fabricating a nonvolatile memory device may include forming an isolation trench defining an active region by etching a substrate, sequentially forming a charge trapping layer on a surface of the isolation trench, forming a gap-fill insulating layer to partially fill the isolation trench on the charge trapping layer, a gate on the substrate to fill a remaining portion of the isolation trench, and forming a source and a drain on the active region under both sides of the gate.

The forming of the gap-fill insulating layer comprises forming the gap-fill insulating layer on an entire surface to fill the isolation trench, and performing a wet-etching operation of the gap-fill insulating layer.

An etching depth of the gap-fill insulating layer is substantially the same as or deeper than a depth of each of the source and the drain.

The for fabricating a nonvolatile memory device, before forming the charge blocking layer further comprises forming a threshold voltage adjusting region on the active region by an ion-injection process, and forming a gate insulating layer on the active region.

A bottom plane of the threshold voltage adjusting region is formed to be higher than a bottom plane of each of the source and the drain.

BRIEF DESCRIPTION OF THE DRAWINGS

FIGS. 4A to 4F are cross-sectional views illustrating a method for fabricating a nonvolatile memory device in accordance with an embodiment of the present invention.

DETAILED DESCRIPTION

Figure 1:
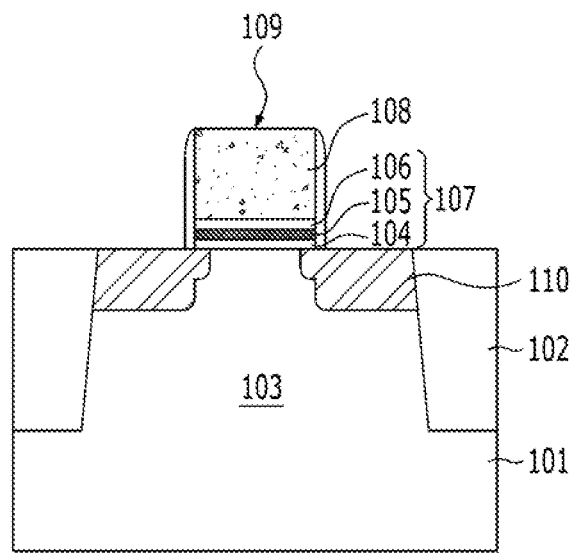
FIG. 1 is a cross-sectional view illustrating a cell of a conventional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

The embodiments of present invention provide a nonvolatile memory device and a method for fabricating the same, which may easily apply to an embedded memory and have excellent logic compatibility. More specifically, embodiments of the present invention provide a nonvolatile memory device of SONOS type and a method for fabricating the same having excellent logic compatibility. That is, the embodiments of present invention provide a nonvolatile memory device and a method for fabricating the same using a liner layer, which is formed through a trench type isolation process, as a memory layer without forming the memory layer through an additional process. For reference, the liner layer includes a wall oxide layer, a liner nitride layer and a liner oxide layer, which are sequentially stacked and formed on a surface of the trench type isolation.

Moreover, as described below, a first conductive type is complementary with a second conductive type. That is, if the first conductive type is a p-type, the second conductive type is an n-type, and if the first conductive type is the n-type, the second conductive type is the p-type. This represents that the nonvolatile memory device in accordance with embodiments of the present invention may be an N-channel type or a P-channel type.

Hereinafter, for the convenience of the descriptions, a nonvolatile memory device of N-channel type is described exemplarily. That is, the first conductive type is the P-type, and the second conductive type is the N-type.

Figure 2A:
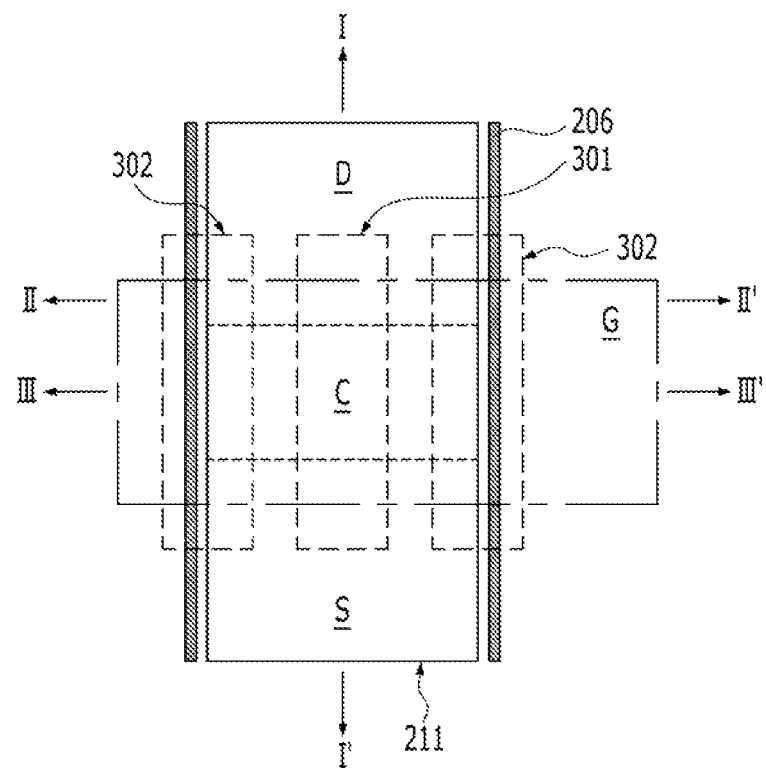
FIGS. 2A to 2E are diagrams illustrating a cell of a nonvolatile memory device in accordance with an embodiment of the present invention.
Figure 2B:
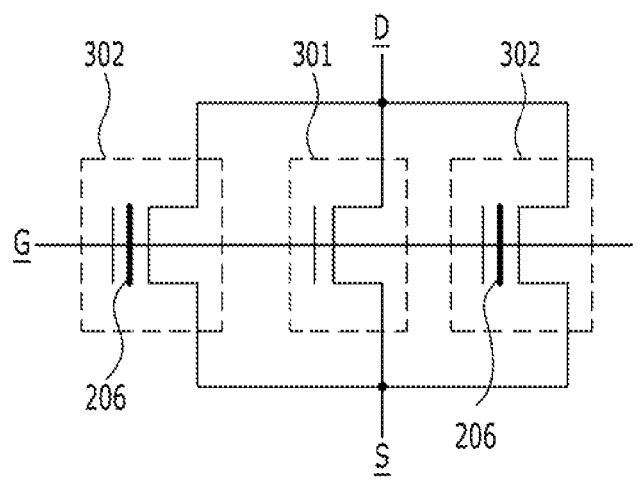
Figure 2C:
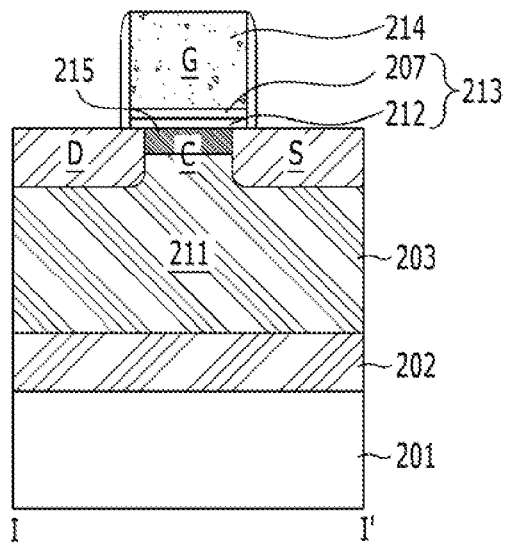
Figure 2D:
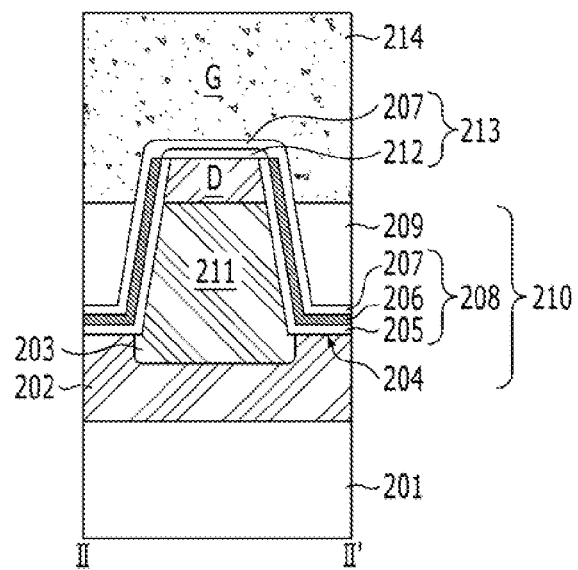
Figure 2E:
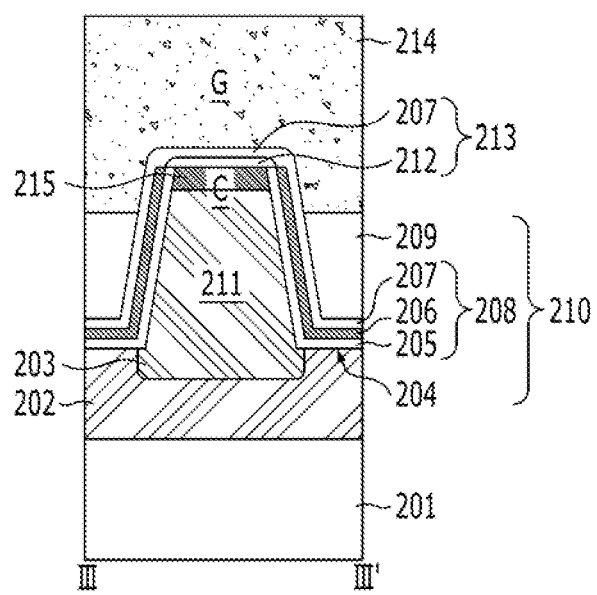

FIGS. 2A to 2E are diagrams illustrating a cell of a nonvolatile memory device in accordance with an embodiment of the present invention. FIG. 2A is a top view of a cell of a nonvolatile memory device, FIG. 2B is an equivalent circuit diagram, FIG. 2C is a cross-sectional view of a cell taken along an I-I' dotted line, FIG. 2D is a cross-sectional view of a cell taken along an dotted line, and FIG. 2E is a cross-sectional view of a cell taken along an dotted line.

As shown in FIGS. 2A to 2E, a nonvolatile memory device in accordance with an embodiment of the present invention includes a plurality of unit cells. Each of the plurality of unit cells includes a first transistor 301 and a plurality of second transistor 302. The first transistor 301 has a fixed threshold voltage. The plurality of second transistors 302 are coupled to the first transistor 301 in parallel and have a variable threshold voltage. The first transistor 301 and the plurality of second transistors 302 may share a gate G, a source S and a drain D.

A threshold voltage of the unit cell is determined by a sum of a threshold voltage of the first transistor 301 and a threshold voltage of the plurality of second transistors 302. A programming operation or an erase operation of the unit cell is determined by the threshold voltage of the plurality of second transistors 302. The programming operation or erase operation of the unit cell may be determined by comparing the threshold voltage of the unit cell with the threshold voltage of the first transistor 301. For example, if the threshold voltage of the unit cell is higher than the threshold voltage of the first transistor 301, the unit cell may be under a programmed state, and if the threshold voltage of the unit cell is lower than the threshold voltage of the first transistor 301, the unit cell may be under an erased state.

The first transistor 301 having a fixed threshold voltage represents a transistor having one threshold voltage, and the plurality of second transistors 302 having a variable threshold voltage represents transistors having at least two threshold voltages of which values are different. More specifically, the second transistor 302 may include a transistor of SONOS type having a memory layer 208. The transistor of SONOS type may use a liner layer of an isolation structure 210, which isolates neighboring unit cells, as the memory layer 208 for storing logic information.

Hereinafter, a nonvolatile memory device in accordance with an embodiment of the present invention will be more specifically described in a view of a structure.

A nonvolatile memory device in accordance with an embodiment of the present invention includes a substrate 201, a second conductive type deep well 202 and a first conductive type isolated well 203. The substrate 201 may include a semiconductor substrate. The semiconductor substrate may be a single crystal state, and include a silicon-containing material. That is, the semiconductor substrate may include a silicon-containing material having a single crystal state. For example, the substrate 201 may be a bulk silicon substrate or a silicon-on-insulator (SOI) substrate, where a supporting substrate, a buried insulating layer, and a single crystal silicon layer are sequentially stacked.

The second conductive type deep well 202 is formed on the substrate 201. A bottom plane of the second conductive type deep well 202 may lower than a bottom plane of the first conductive type isolated well 203. The first conductive type isolated well 203 is formed on the second conductive type deep well 202. The second conductive type deep well 202 and the first conductive type isolated well 203 may be formed to provide a base for an operation of the unit cell by ion-injecting impurities on the substrate 201.

Meanwhile, in another embodiment of the present invention, for example, only the first conductive type isolated well 203 may be formed. For example, if the nonvolatile memory device uses an FN tunneling process during an erase operation, the first conductive type isolated well 203 and the second conductive type deep well 202 may be necessarily formed. If the nonvolatile memory device uses a bend-to-bend-tunneling (BTBT) process, for example, only the first conductive type isolated well 203 may be formed, and the second conductive type deep well 202 may not be formed.

Moreover, the nonvolatile memory device in accordance with an embodiment of the present invention may further include an isolation structure 210, which defines an active region by being formed on the substrate 201. The active region 211 may be a bar type or a line type, having a long axis and a short axis, and may have a protrusion unit, which is protruded toward a specific direction. The isolation structure 210 includes an isolation trench 204, a memory layer 208, and a gap-fill insulating layer 209. The isolation trench 204 is formed on the substrate 201 and defines the active region. The memory layer 208 is formed on a surface of the isolation trench 204. The gap-fill insulating layer 209 gap-fills the isolation trench 204 on the memory layer 208. The isolation structure 210 may be formed by a shallow trench isolation (STI) process. The isolation trench 204 may have a sloped side wall to easily perform a memory layer forming process and a gap-fill insulating layer forming process. Since the gap-fill insulating layer 209 formed on the memory layer 208 partially fills the isolation trench 204, the memory layer 208 and the active region 211 may be protruded over the gap-fill insulating layer 209.

The memory layer 208 may be a stacked layer, where a tunnel insulating layer 205, a charge trapping layer 206, and a charge blocking layer 207 are sequentially stacked, and may include an insulating layer. The tunnel insulating layer 205, the charge trapping layer 206 and the charge blocking layer 207 each may include one signal layer or at least two stacked layer selected from a group including an oxide layer, a nitride layer and an oxide-nitride layer. The tunnel insulating layer 205 may be formed along a surface of the isolation trench 204, and may include an oxide layer. The tunnel insulating layer 205 is referred to as 'a wall oxide layer'. The charge trapping layer 206 may be formed on the tunnel insulating layer along a surface of the isolation trench 204, and may include a nitride layer. The charge trapping layer 206 is referred to as 'a liner nitride layer'. The charge blocking layer 207 may be formed along a surface of the substrate 201 having the isolation trench 204, or be formed along the surface of the substrate 201 having the gap-fill insulating layer 209 as referred to as a numeral number 27 of FIG. 4E. The charge blocking layer 207 may not be expanded on the active region 211, and be formed on the charge trapping layer 206 exposed by the gap-fill insulating layer 209. The charge blocking layer 207 may include an oxide layer, and is referred to as 'a liner oxide layer'. The memory layer 208 may include a liner layer of the isolation structure 210, where the wall oxide layer, the liner nitride layer, and the liner oxide layer are sequentially stacked.

Moreover, a nonvolatile memory device in accordance with an embodiment of the present invention may include a gate G, which is formed on the substrate 201 having the isolation structure 210. The gate G may include a gate insulating layer 213 and a gate electrode 214, which are sequentially stacked. The gate insulating layer 213 may include a thickness adjusting layer 212 for adjusting a thickness of the insulating layer 213 and the charge blocking layer 207 expanded from the memory layer 208 to the active region 211. The thickness adjusting layer 212 may include an insulating layer, and be a single layer or at least two stacked layers selected from a group including an oxide layer, a nitride layer and an oxide-nitride layer. The thickness adjusting layer 212 may be a material layer, e.g., an oxide layer, which is identical to the charge blocking layer 207. The gate electrode 214 may have a bar type shape or a line type shape. The gate electrode 214 may have a gap-filled shape of remaining isolation trench on the gap-fill insulating layer 209. Thus, the active region 211, the memory layer 208 and the gate G may be overlapped with each other.

Moreover, a nonvolatile memory device in accordance with an embodiment of the present invention may include a source S of a second conductive type and a drain D of the second conductive type, which are formed under a side of a gate G and the other side of the gate G, respectively. An active region between the source S and the drain D under the gate is defined as a channel C. A threshold voltage adjusting region 215 of a first conductive type for adjusting a threshold voltage may be formed on the channel C. The source S, the drain D and the threshold voltage adjusting region 215 may be formed by ion-injecting impurities. As a requested threshold voltage is increased, an impurity doping concentration of the threshold voltage adjusting region 215 may be increased. For example, the impurity doping concentration of the threshold voltage adjusting region 215 may be higher than an impurity doping concentration of the isolated well 203. A depth of the threshold voltage adjusting region 215 may be shallower than a depth of each of the source C and the drain D based on an upper plane of the substrate 201. This may minimize interference between the threshold voltage adjusting region 215 and the source C and the drain D, and may form a channel C by the gate. A bottom plane of each of the source C and the drain D may be located on a same plane as, or a higher plane than the upper plane of the gap-Fill insulating layer 209. This may maximize an overlapping area between the source S and the drain D, and the gate G and the memory layer 208.

As described above, in the nonvolatile memory device, the plurality of second transistors 302 may be arranged adjacently to the isolation structure 210, and the first transistor 301 may be arranged on a center of the active region 211 between the plurality of second transistors 302. The first transistor 301 and the plurality of second transistors 302 may include a same gate G, source S and drain D. The first transistor 301 has a threshold voltage fixed by the threshold voltage adjusting region 215. The first transistor 301 may control an operation characteristic of the unit cell and a size of the threshold voltage of the first transistor 301 by adjusting the impurity doping concentration of the threshold voltage adjusting region 215. In the plurality of second transistors 302, a programming process and an erase process may be performed by a charge trapping and detrapping in an overlapping region of the gate G, the memory layer 208 and the active region 211 including a source S, a drain D, and a channel C. As a result, a variable threshold voltage may be acquired.

The nonvolatile memory device having the aforementioned structure may prevent a characteristic deterioration caused by a memory layer forming process and improve logic compatibility by using the liner layer of the isolation structure 210 as the memory layer 208.

Moreover, since the first transistor 301 having a fixed threshold voltage and the plurality of second transistor 302 having a variable threshold voltage are coupled to each other in parallel, an operation characteristic of the nonvolatile memory device may improve.

Also, since a cell structure is simple, an integration of the nonvolatile memory device may be effectively improved, and various operation processes may be applied.

Hereinafter, an operation of a unit cell of a nonvolatile memory device in accordance with an embodiment of the present invention will be described with reference to FIGS. 2A to 2E and Table 1. Table 1 illustrates an example of an operation condition of a unit cell of a nonvolatile memory device in accordance with an embodiment of the present invention. A nonvolatile memory device in accordance with an embodiment of the present invention may use various operation process and be used in various utilities.

TABLE 1

| Operation | Manner | Gate | Drain | Source | Isolated well/ Deep well |
|---|---|---|---|---|---|
| Programming | HCI | VPP | VPP | VSS | VSS |
|  | FN tunneling | VPP | Floating | Floating | −VPP |
| Erasing | BTBT_Drain | −VPP | VPP | VSS | VSS |
|  | BTBT_Source | −VPP | VSS | VPP | VSS |
|  | FN tunneling | −VPP | Floating | Floating | VPP |
| Reading | Forward | VCC | Vread (~1 V) | VSS | VSS |
|  | Reverse | VCC | VSS | Vread (~1 V) | VSS |

First, a programming operation may be performed using a hot carrier injection (HCI) manner. In case of using the HCI manner, the programming operation may be performed by supplying a first programming voltage and a second programming voltage to a gate G and a drain D, respectively, and supplying a ground voltage VSS to a source 5, an isolated well 203 and a deep well 202. Herein, the first programming voltage and the second programming voltage may have a same polarity voltage, e.g., a positive voltage. The first programming voltage a id the second programming voltage may be a pumping voltage VPP.

In case of using the HCI manner, since an abrupt junction is formed between the channel C and the drain D by the threshold voltage, a programming characteristic may be improved due to a thermal charge. For reference, as an impurity doping concentration of the threshold voltage adjusting region 215 is getting higher than an impurity doping concentration of the isolated well 203, the abrupt junction may be easily formed.

Meanwhile, the programming operation may be performed using the FN tunneling manner. In case of using the FN tunneling manner, the programming operation may be performed by supplying the first programming voltage and the second programming voltage to the gate G, and the isolated well 203 and the deep well 202, respectively, and floating the source S and the drain D. Herein, the first programming voltage and the second programming voltage may have a different polarity voltage. That is, the first programming voltage is a positive voltage, and the second programming voltage is a negative voltage. For example, the first programming voltage is the pumping voltage VPP, and the second programming voltage is a negative pumping voltage −VPP.

Next, the erase operation may use the BTBT manner. For reference, the 'BTBT_Drain' of Table 1 represents an erase operation by a band tunneling between the gate G and the drain D. The 'BTBT_Source' of Table 1 represents an erase operation by a band tunneling between the gate G and the source S. Hereinafter, for the convenience of the descriptions, the 'BTBT_Drain' will be described as an exemplary description.

The erase operation using the BTBT manner may be performed by supplying a first erase voltage and a second erase voltage to the gate G and the drain D, respectively, and supplying the ground voltage VSS to the source S, the isolated well 203 and the deep well 202. The first erase voltage and the second erase voltage may have a different polarity voltage. That is, the first erase voltage may be a negative voltage, and the second erase voltage may be a positive voltage. For example, the first erase voltage may be a negative pumping voltage −VPP, and the second erase voltage may be a pumping voltage VPP.

Meanwhile, the erase operation may be performed using the FN tunneling manner. In case of using the FN tunneling manner, the erasing operation may be performed by supplying the first erase voltage and the second erase voltage to the gate G, and the isolated well 203 and the deep well 202, respectively, and floating the source S and the drain D. The first erase voltage and the second voltage may have a different polarity voltage. That is, the first erase voltage may be a negative voltage, and the second erase voltage may be a positive voltage. For example, the first erase voltage may be a negative pumping voltage −VPP, and the second erase voltage may be a positive pumping voltage VPP.

Next, a read operation may be classified into a forward read operation and a reverse read operation. The forward read operation represents that a read operation is performed by drifting a charge along a same direction with a drift direction of a charge during a programming operation. The reverse read operation represents that the read operation is performed by drifting the charge along an opposite direction to the drift direction of the charge during the programming operation. Since a cell array of the forward read operation may be implemented with a simple structure as compared with the reverse read operation, it has merits in a fabricating operation and integration. The reverse read operation has a high resistance for a read disturbance as compared to the forward read operation.

In case of the forward read operation, an activation voltage and a read voltage are supplied to the gate G and the drain D, respectively, and the ground voltage VSS is supplied to the source S, the isolated well 203 and the deep well 202. In case of the reverse read operation, the activation voltage and the read voltage are supplied to the gate G and the source S, respectively, and the ground voltage VSS is supplied to the drain D, the isolated well 203, and the deep well 202. The activation voltage and the read voltage may be a positive voltage. The activation voltage may be a power supply voltage VCC for inducing a channel of the unit cell.

As described above, the nonvolatile memory device in accordance with an embodiment of the present invention may use a programming operation, an erase operation, and a read operation. The embodiment may have various structural variations.

Hereinafter, a cell array using a unit cell and its operation method of the above-described nonvolatile memory device will be described with reference to FIGS. 3A to 3C. Since the unit cell of the nonvolatile memory device in accordance with an embodiment of the present invention has a simple structure, a cell array having a plurality of unit cells, which are arrayed in a matrix shape, has a simple structure. Thus, for the convenience of the descriptions same configuration as the configuration shown in FIGS. 2A to 2E uses a same numeral number as the numeral number shown in FIGS. 2A to 2E.

Figure 3A:
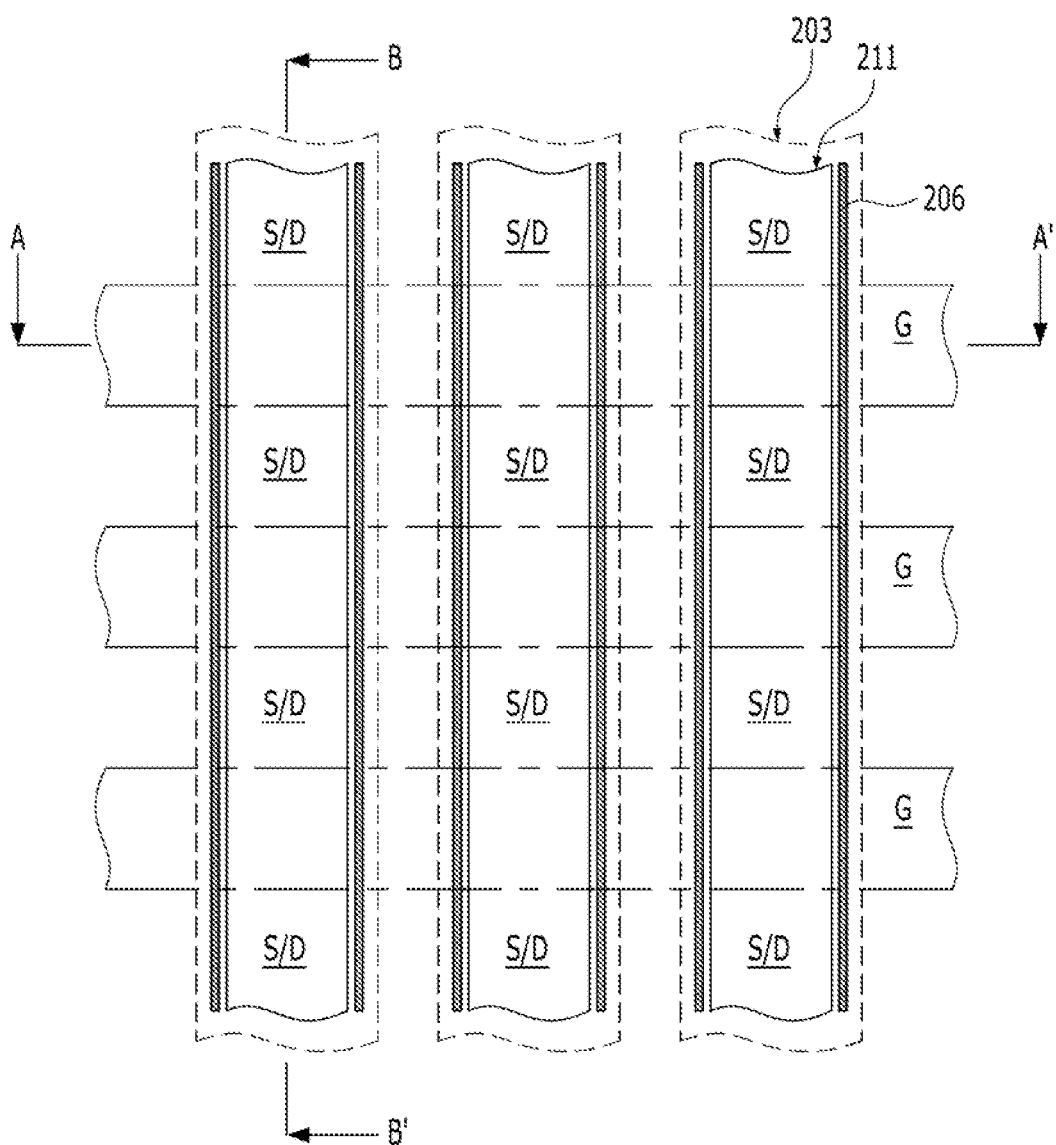
FIGS. 3A to 3C are diagrams illustrating a cell array of a nonvolatile memory device in accordance with an embodiment of the present invention.
Figure 3B:
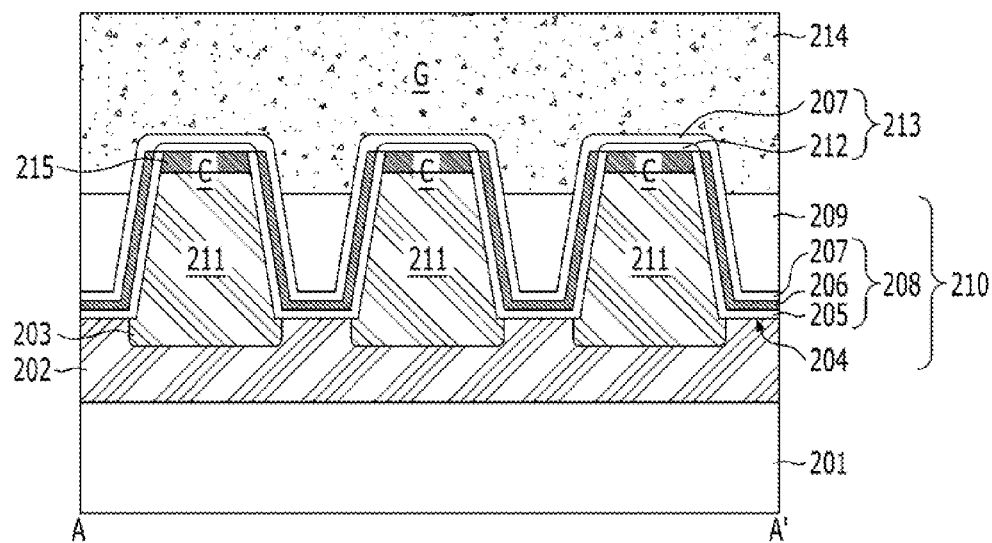
Figure 3C:
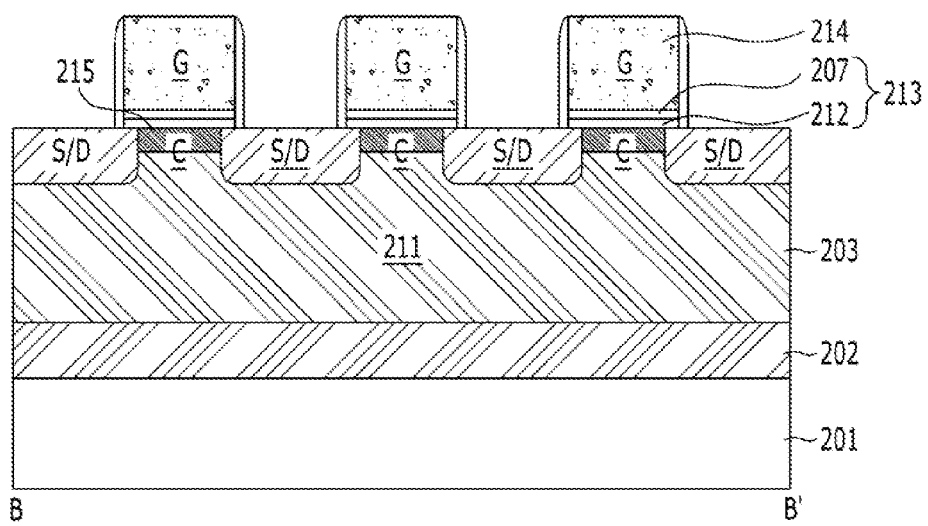

FIGS. 3A to 3C are diagrams illustrating a cell array of a nonvolatile memory device in accordance with an embodiment of the present invention. FIG. 3A is a top view of the cell array. FIGS. 3B and 3C are cross-sectional views taken along dotted lines A-A' and B-B', respectively.

As shown in FIGS. 3A to 3C, a cell array of a nonvolatile memory device in accordance with an embodiment of the present invention includes a substrate 201, a deep well 202, and a plurality of isolated wells 203. Each of the plurality of isolated wells 203 may have a bar type shape or a line type shape having a long axis and a short axis corresponding to an active region 211. Each of the plurality of isolated wells 203 is isolated by a junction isolation between isolation structure 210 and the deep well 202 and isolated well 203. The nonvolatile memory device in accordance with an embodiment of the present invention may need the isolated well 203 and the deep well 202 in case of using the FN tunneling manner during an erase operation, and may need, for example, only the isolated well 203 in case of using the BTBT manner during the erase operation.

Moreover, the cell array of the nonvolatile memory device in accordance with an embodiment of the present invention may include the isolation structure 210, which defines the active region 211 of a bar type or a line type having a long axis and a short axis. The active region 211 may be expanded toward the long axis direction, and be arranged in parallel toward the short axis direction.

The cell array of the nonvolatile memory device in accordance with an embodiment of the present invention may be formed on the substrate 201 having the isolation structure 210, and include the plurality of gates G, which is formed on the isolation structure 210 and the plurality of active regions 211. The gate G may be the bar type or the line type having the long axis and the short axis, and be expanded toward a cross direction with the active region 211.

As described above, a cell array of the nonvolatile memory device in accordance with an embodiment of the present invention may be implemented by arranging a plurality of unit cells in a matrix shape. Thus, the integration and compatibility of the nonvolatile memory device may be improved, and various operation processes may be used in the nonvolatile memory device in accordance with an embodiment of the present invention.

FIGS. 4A to 4F are cross-sectional views illustrating a method for fabricating a nonvolatile memory device in accordance with an embodiment of the present invention.

Figure 4A:
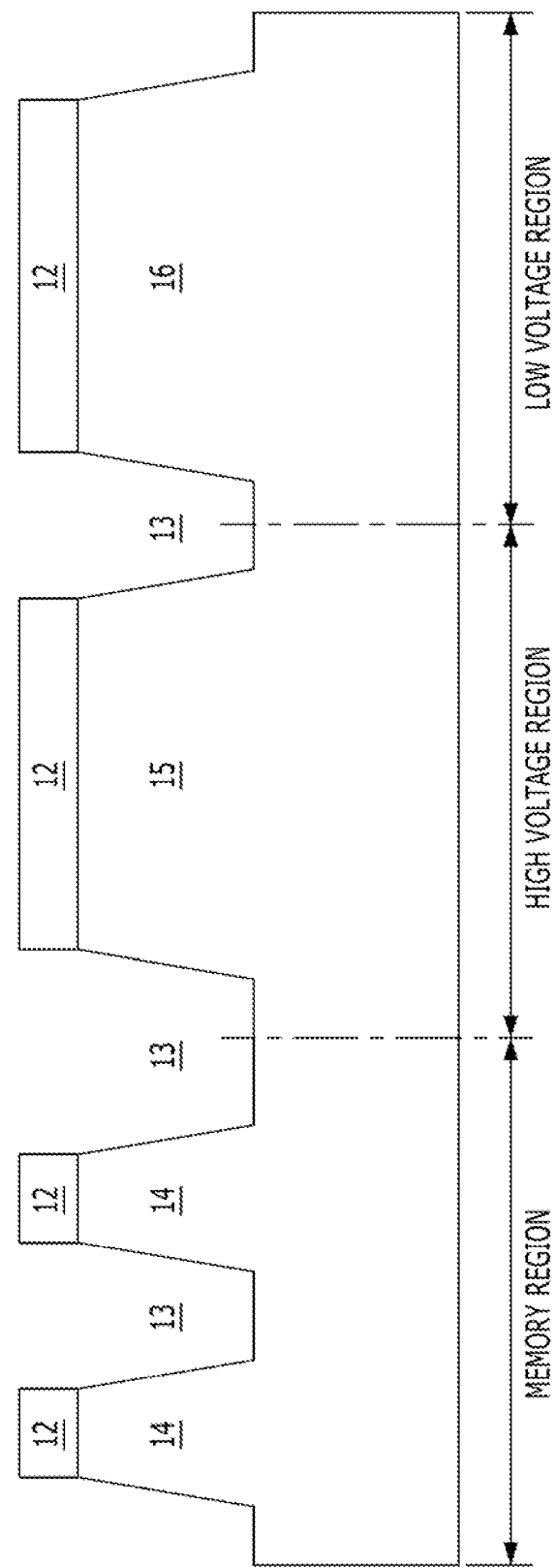

As shown in FIG. 4A, a substrate 11 having a logic region and a memory region is provided. The logic region may include a power device region, a CMOS region and the like. In this embodiment of the present invention, the logic region is illustrated as the power device region. The power device region may include a low voltage region and a high voltage region. The high voltage region is for driving a higher voltage than that of the low voltage region. The memory region may include the nonvolatile memory device in accordance with above-described embodiments of the present invention. The substrate 11 may include a semiconductor substrate. The semiconductor substrate may be a single crystal state, and include a silicon-containing material. That is, the semiconductor substrate may include a silicon-containing material of a single crystal. For example, a bulk silicon substrate or a silicon-on-insulator (SOI) substrate may be used as the substrate 11.

Subsequently, a mask pattern 12 for isolating elements is formed on the substrate 11. An isolation trench 13 is formed by etching the substrate 11 using the mask pattern 12 as an etch barrier. An etching process for forting the isolation trench 13 may be performed through a dry etching process. A side wall of the isolation trench 13 may be sloped. The isolation trench 13 formed on each region may have a different aspect ratio.

Herein, a plurality of active regions are defined by forming the isolation trench 13 on the substrate 11. Hereinafter, for the convenience of the descriptions, an active region of the memory region is referred to as 'a first active region 14' an active region of the high voltage region is referred to as 'a second active region 15', and an active region of the low voltage region is referred to as 'a third active region 16'.

Figure 4B:
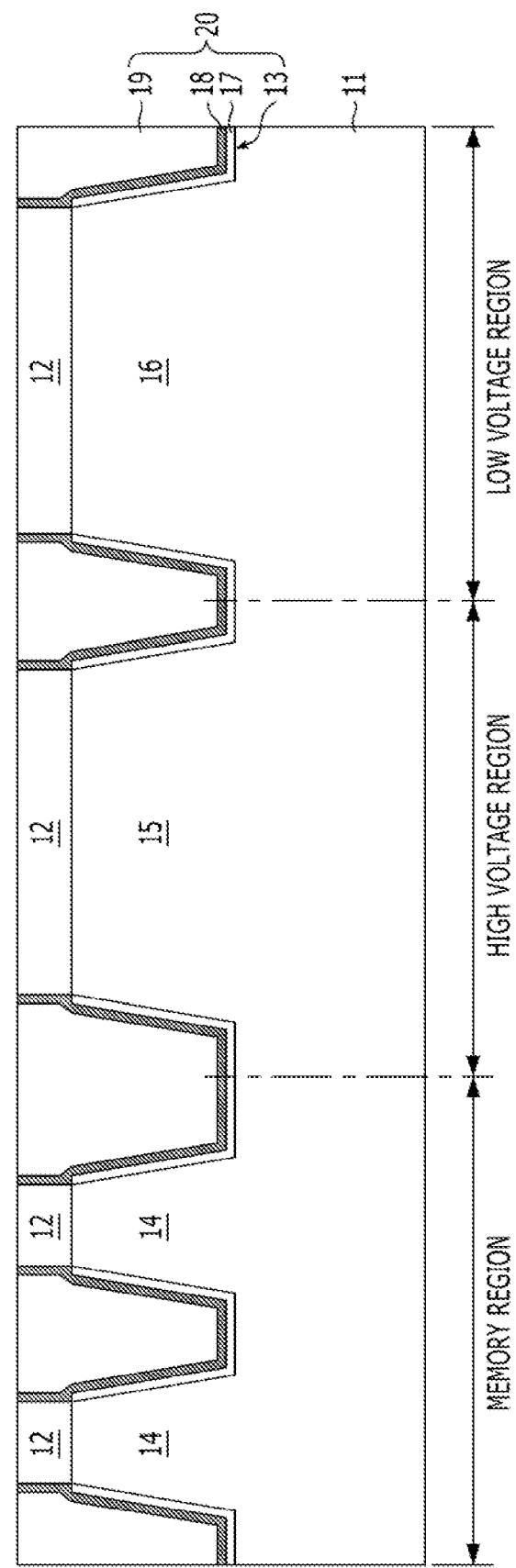

As shown in FIG. 4B, a first liner layer 17 is formed on a surface of the isolation trench 13. The first liner layer 17 repairs defection or damage formed on the surface of the isolation trench 13 during the isolation trench forming process. The first liner layer 17 is operated as a tunnel insulating layer in the memory region. The first liner layer 17 may be formed with an oxide layer. The oxide layer may be formed by using a thermal oxidation process. The first liner layer 17 may be formed on the surface of the isolation trench 13 by the characteristic of the thermal oxidation process.

Subsequently, a second liner layer 18 is formed along a surface of a structure having the first liner layer 17. The second liner layer 18 prevents the impurities from being diffused. The second liner layer 18 is operated as a charge trapping layer in the memory region. The second liner layer 18 may be formed with a nitride layer. The second liner layer 18 may be formed to have a uniform thickness along the surface of the structure having the isolation trench 13.

Next, a gap-fill insulating layer 19 for filling the isolation trench 13 and covering an entire surface of the substrate 11 is formed on the second liner layer 18. The gap-fill insulating layer 19 may be formed with an oxide layer, e.g., a high density plasma (HDP) oxide.

Subsequently, a planarization process is performed for the gap-fill insulating layer 19 and the liner layer 18 until the mask pattern 12 is exposed. The planarization process may be performed using a chemical mechanical polishing (CMP). When the planarization process is completed, a surface of the gap-fill insulating layer 19 and a surface of the mask pattern 12 is located on a same plane, or the surface of the gap-fill insulating layer 19 may be lower than the surface of the mask pattern 12 due to a polishing selectivity difference between the mask pattern 12 and the gap-fill insulating layer 19.

Thus, an isolation structure 20 including the isolation trench 13, the first liner layer 17, the second liner layer 18, and the gap-fill insulating layer 19 may be formed. The first liner layer 17 is formed on the surface of the isolation trench 13. The gap-fill insulating layer fills the isolation trench 13 on the second liner layer 18.

Meanwhile, although an embedded memory having a conventional nonvolatile memory device having an SONOS type has an isolation structure having a liner layer on a high voltage region and a low voltage region, a separate process for removing a liner layer, especially, a second liner layer is performed in the isolation structure of a memory region in order to prevent a characteristic deterioration caused by a charge trapping characteristic of the second liner layer. However, since the nonvolatile memory device in accordance with an embodiment of the present invention implements a memory element using the charge trapping characteristic of the second liner layer 18, fabricating process steps may be reduced.

Figure 4C:
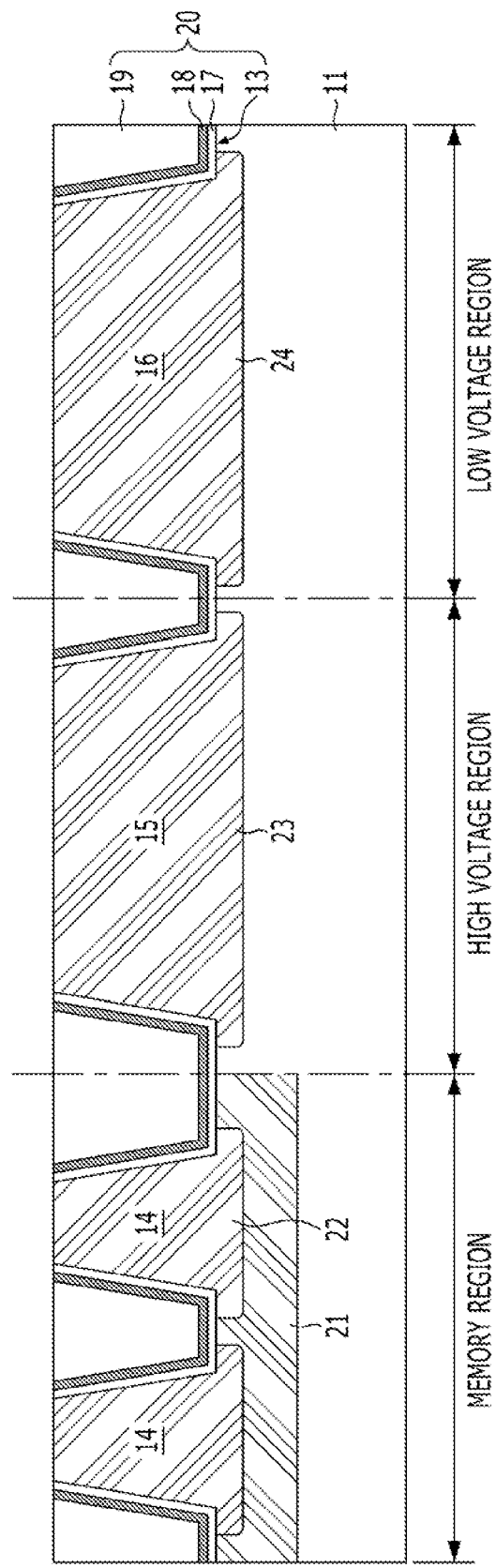

As shown in FIG. 4C, an etching process for removing the mask pattern 12 is performed, and a cleaning process is performed to adjust a height of the isolation structure 20, which is protruded over the substrate 11, by removing the mask pattern 12. The etching process and the cleaning process may be performed as a wet process.

Meanwhile, in the embodiment of the present invention, when the etching process and the cleaning process are completed, the surface of the substrate 11 is shown to be exposed. But, in order to prevent the surface of the substrate from being damaged in a post-process, a screen insulating layer (not shown) may be remained on an entire surface of the substrate, or the screen insulating layer (not shown) may be formed after the cleaning process.

Subsequently, a plurality of wells are formed by ion-injecting impurities on the substrate 11 corresponding to the memory region, the high voltage region and low voltage region, respectively. More specifically, in the memory region, after a second conductive type deep well 21 is formed on the substrate 11, a first conductive type isolated well 22 is formed to correspond to the first active region 14 on the second conductive deep well 21. In the high voltage region and the low voltage region, a first conductive type first well 23 and a first conductive type second well 24 are formed to correspond to the second active region 15 and the third active region 16 on the substrate 11, respectively.

Next, impurities (not shown) for selectively adjusting a threshold voltage may be ion-injected on each region. For example, a threshold voltage adjusting region (not shown) may be formed by ion-injecting first conductive type impurities on a surface of the isolated well 22 of the memory region to adjust the threshold voltage of the memory cell.

Figure 4D:
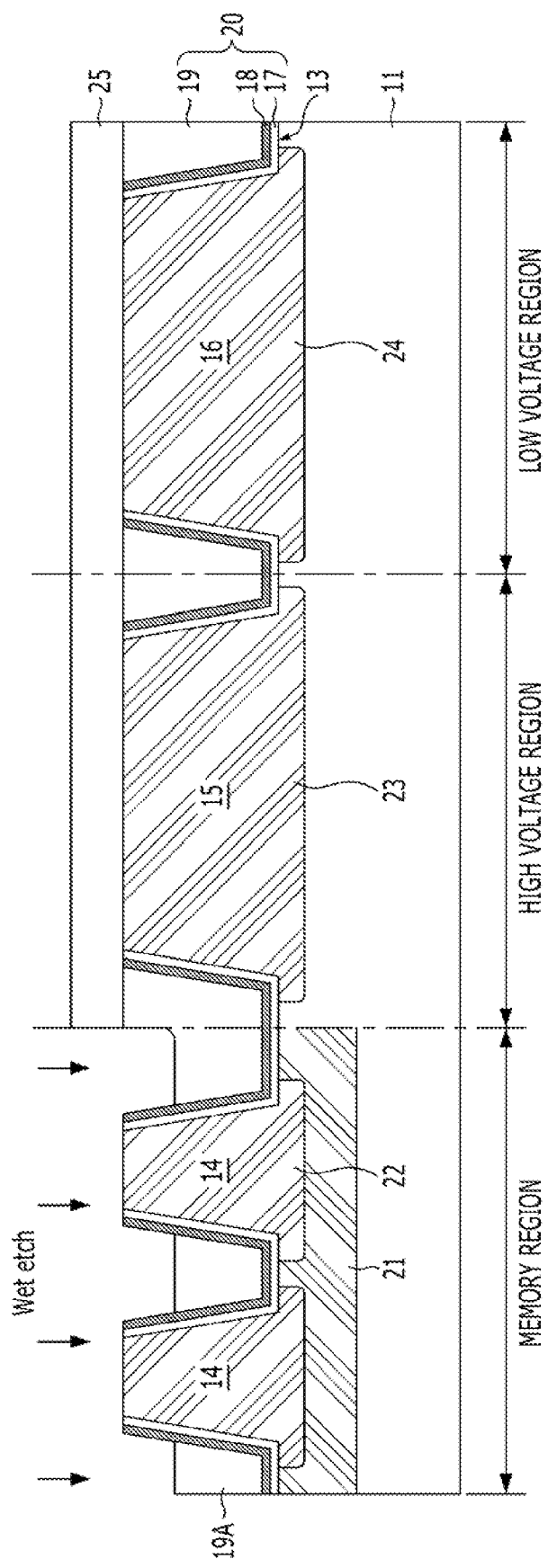

As shown in FIG. 4D, the memory region is opened on the substrate 11. For example, after a mask pattern 25 covering the high voltage region and the low voltage region is formed, a part of the gap-fill insulating layer 19 of the memory region is recessed using the mask pattern 25 as an etching wall. An etching process for forming a recessed gap-fill insulating layer 19A may be performed with a wet etch to minimize a processing burden provided to the structure. For example, in case that the gap-fill insulating layer 19 is an oxide layer, the etching process for forming the recessed gap-fill insulating layer 19A may be performed using a buffered oxide etchant (BOE) solution. A charge trapping layer (that is, a second liner layer 18) of an upper region of the isolation trench is exposed, and an etching depth of the recessed gap-fill insulating layer 19A may be adjusted to correspond to a depth of each of a source and a drain to be formed through a post-process so that a channel may be formed. More specifically, the etching depth of the recessed gap-fill insulating layer 19A may be controlled to be substantially the same as or deeper than a depth of each of the source and the drain to be formed through the post-process.

For reference, since the etching process for forming the recessed gap-fill insulating layer 19A is a simple process for etching a part of the gap-fill insulating layer 19 through the wet-etching operation, there is very low probability to have a negative influence on the structure.

Figure 4E:
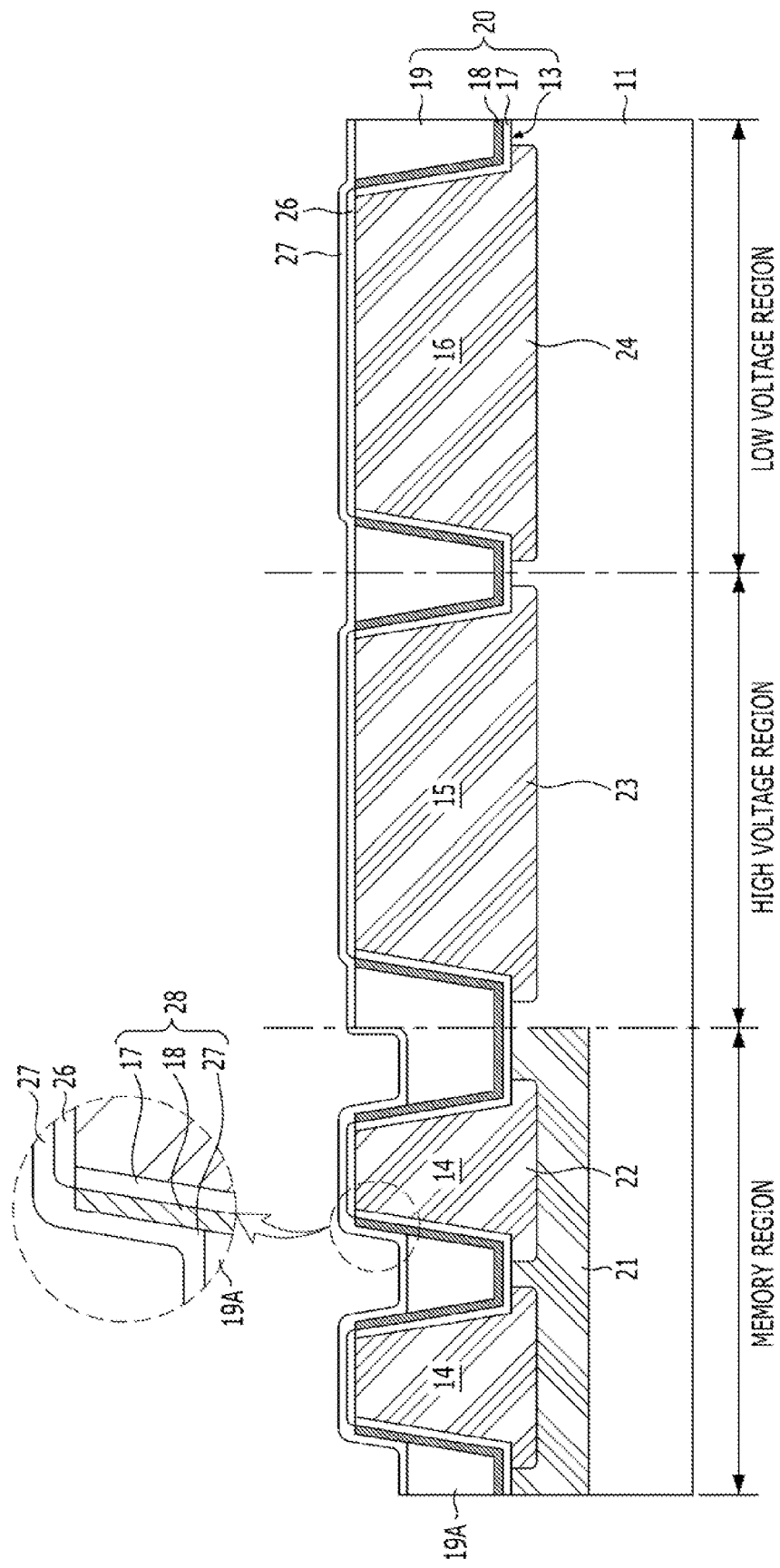

As shown in FIG. 4E, after removing the mask pattern 25, an insulating layer 26, which is operated as a gate insulating layer, is formed on the first active region 14 to the third active region 16. The insulating layer 26 provides a thickness of the gate insulating layer, which is requested by a transistor formed on each region. The insulating layer 26 formed on each region may have a same thickness or a different thickness. The insulating layer 26 may be formed with one single layer or at least two stacked layers selected from a group including an oxide layer, a nitride layer and an oxide-nitride layer. For example, the insulating layer 26 may be formed with an oxide layer through a thermal oxidation.

Subsequently, a third liner layer 27 is formed along a surface of the structure having the insulating layer 26 and the recessed gap fill insulating layer 19A. The third liner layer 27 is operated with the insulating layer as a gate insulating layer and is operated as a charge blocking layer in the memory region. The third liner layer may be formed with an oxide layer.

Thus, a gate insulating layer having a stacked structure of the insulating layer 26 and the third liner layer 27 may be formed on the active region of each region, A liner layer (that is, the memory layer 28) having the first liner layer 17, the second liner layer 18 and the third liner layer 27, which are sequentially stacked, may be formed on a surface of the isolation trench 13 of the memory region. That is, the memory layer 28 is operated as the liner layer of the isolation structure 20 in accordance with an embodiment of the present invention.

As shown in FIG. 4F, a gate conductive layer is formed to fill an upper part of the recessed gap-fill insulating layer 19A on an entire surface of the structure having the third liner layer 27. The gate conductive layer may be formed with a silicon-containing material, A silicon layer may be used as the silicon-containing material. For example, a gate conductive layer may be formed with a polysilicon layer.

Subsequently, a gate is formed on each region by sequentially etching the gate conductive layer, the third liner layer 27 and the insulating layer 26. That is, a first gate G1, a second gate G2 and a third gate G3 may be respectively formed on a memory region, a high voltage region, and a low voltage region through the etching process for the gate conductive layer and the gate insulating layer. The first gate G1 to the third gate G3 may be a stacked structure having the gate insulating layer and the gate electrode 29, which are stacked.

A source and a drain are formed by ion-injecting impurities under both sides of each of the first gate G1 to the third gate G3. Since the source and the drain of the memory region are not shown in drawings, but are described in the above-described unit cell and the cell array structure, the detailed descriptions will be omitted.

As described above, by using the liner layer of the isolation structure 20 as the memory layer 28 of the nonvolatile memory device of the SONOS type, a configuration of the nonvolatile memory device may be simplified, the integration may be increased easily, a characteristic deterioration caused by the memory layer forming process may be prevented, and a logic compatibility may be improved.

Hereinafter, a micro processor and a processor having the nonvolatile memory device in accordance with an embodiment of the present invention will be described with reference to FIGS. 5 and 6.

Figure 5:
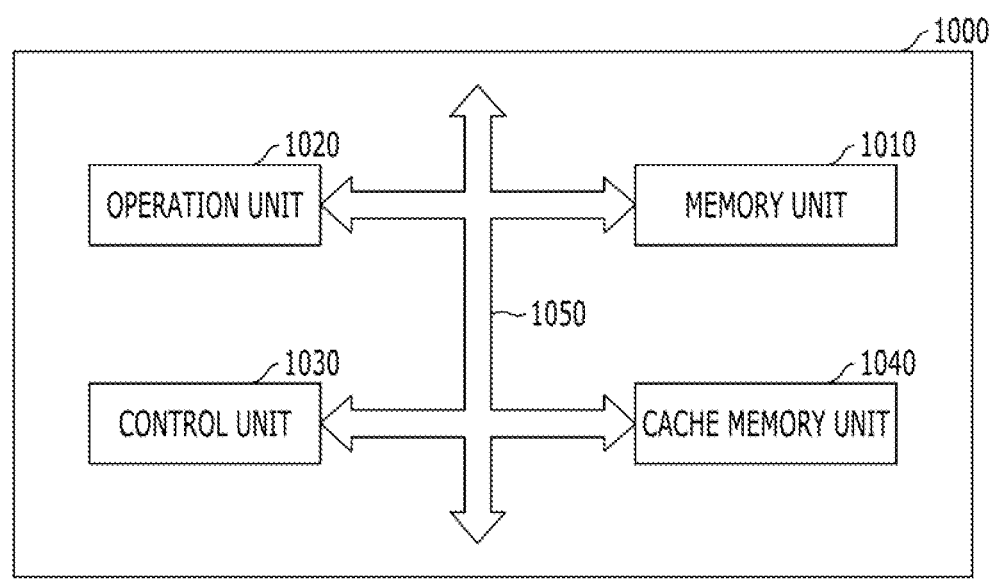
FIG. 5 is a configuration diagram illustrating a micro processor in accordance with an embodiment of the present invention.

FIG. 5 is a configuration diagram illustrating a micro processor in accordance with an embodiment of the present invention.

As shown in FIG. 5, a microprocessor 1000 performs tasks for controlling and tuning a series of processes of receiving data from various external devices, processing the data, and outputting processing results to external devices. The microprocessor 1000 includes a memory unit 1010 an operation unit 1020 and a control unit 1030. The microprocessor 1000 may be various processing units such as a central processing unit (CPU), a graphic processing unit (GPU), a digital signal processor (DSP) and an application processor (AP).

The memory unit 1010 is a part that stores data in the microprocessor 1000 as a processor register or a register. The memory unit 1010 may include a data register, an address register and a floating point register. Besides, the memory unit 1010 may include various registers. The memory unit 1010 may perform the function of temporarily storing addresses where data for which operations are to be performed by the operation unit 1020, result data of performing the operations and data for performing of the operations are stored.

The memory unit 1010 may include the aforementioned nonvolatile memory device. The memory unit 1010 including the semiconductor device in accordance with the aforementioned embodiment includes a first transistor having a fixed threshold voltage and a second transistor, which is coupled to the first transistor in parallel and has a variable threshold voltage. The first transistor and the second transistor may include a plurality of unit cells, which share a gate, a source, and a drain. The second transistor may be an SONOS type transistor having a memory layer. The memory layer may be a liner layer of an isolation structure that separates the plurality of unit cells. More specifically, the memory unit 1010 may include an isolation trench, a charge trapping layer, a gap-fill insulating layer, a gate, a source and a drain. The isolation trench is formed on a substrate and defines an active region. The charge trapping layer is formed on a surface of the isolation trench. The gap-fill insulating layer fills a part of the isolation trench. The gate is formed on the substrate to fill a remaining isolation trench on the gap-fill insulating layer. The source and the drain are formed on the active region under both sides of the gate. The memory unit 1010 may simplify a structure of the nonvolatile memory device and may increase the integration thereof by using the liner layer of the isolation structure as the memory layer. The memory unit 1010 may prevent a characteristic deterioration caused by a memory layer forming process and improve the logic compatibility. Thus, the memory unit 1010 and the microprocessor 1000 having the same may be minimized and performed with a high performance.

The operation unit 1020 is a part that performs operations in the microprocessor 1000. The operation unit 1020 performs four arithmetical operations or logical operations based on results that the control unit 1030 decodes commands. The operation unit 1020 may include at least one arithmetic logic unit (ALU).

The control unit 1030 receives signals from the memory unit 1010, the operation unit 1020 and an external device of the microprocessor 1000. Also, the control unit 1030 controls extraction, decoding, input and output of commands, and executes processing represented by programs.

The microprocessor 1000 according to the present embodiment may additionally include a cache memory unit 1040 that may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
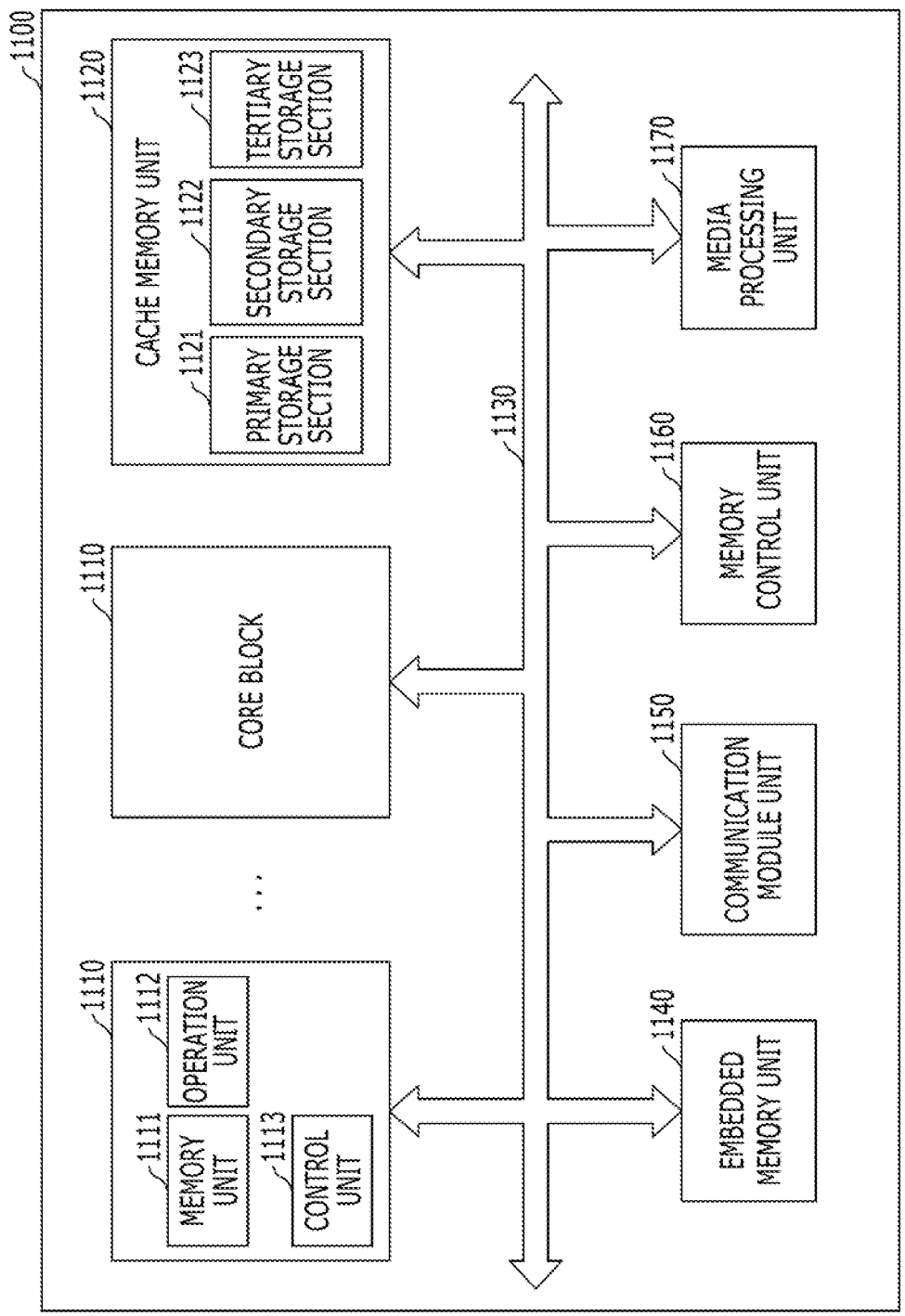
FIG. 6 is a configuration diagram illustrating a processor in accordance with an embodiment of the present invention.

FIG. 6 is a configuration diagram illustrating a processor in accordance with an embodiment of the present invention.

Referring to FIG. 6, a processor 1100 improves performance. Also, the processor 1100 implements multi-functionality by including various functions other than that of a microprocessor that performs tasks for controlling and tuning a series of processes of receiving data from various external devices, processing the data, and outputting processing results to external devices. The processor 1100 includes a core block 1110, a cache memory unit 1120, and a bus interface 1130. The core block 1110 of the present embodiment is a part that performs arithmetic logic operations for data inputted from an external device. The core block 1110 includes a memory unit 1111, an operation unit 1112, and a control unit 1113. The processor 1100 may be various system-on-chips (SoCs) such as a multi-core processor, a graphic processing unit (GPU) and an application processor (AP).

The memory unit 1111 is a part that stores data in the processor 1100 as a processor register or a register. The memory unit 1111 may include a data register, an address register and a floating point register. Besides, the memory unit 1111 may include various registers. The memory unit 1111 may perform the function of temporarily storing addresses where data for which operations are to be performed by the operation unit 1112, result data of performing the operations and data for performing of the operations are stored. The operation unit 1112 is a part that performs operations in the processor 1100. The operation unit 1112 performs four arithmetical operations or logical operations based on results that the control unit 1113 decodes commands. The operation unit 1112 may include at least one arithmetic logic unit (ALU). The control unit 1113 receives signals from the memory unit 1111, the operation unit 1112 and an external device of the processor 1100. Also, the control unit 1113 controls extraction, decoding, input and output of commands, and executes processing represented by programs.

The cache memory unit 1120 is a part that temporarily stores data to compensate for a difference in data processing speed between the core block 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections that are included in the cache memory unit 1120 may be changed according to a design. The speeds at which the primary, secondary, and tertiary storage sections 1121, 1122 and 1123 store and discriminate data may be the same or different. In the case where the speeds of the respective storage sections 1121, 1122 and 1123 are different, the speed of the primary storage section 1121 may be the fastest. Although it was shown in FIG. 6 that all the primary, secondary and tertiary storage sections 1121, 1122 and 1123 are configured in the cache memory unit 1120, it is to be noted that all or part of the primary, secondary and tertiary storage sections 1121, 1122 and 1123 of the cache memory unit 1120 may be configured outside of the core block 1110 and may compensate for a difference in data processing speed between the core block 1110 and the external device. In addition, it is to be noted that the primary storage section 1121 of the cache memory unit 1120 may be disposed in the core block 1110, and the secondary storage section 1122 and the tertiary storage section 1123 may be configured outside of the core block 1110 to strengthen the function of compensating for a difference in data processing speed.

The bus interface 1130 is a part that connects the core block 1110 and the cache memory unit 1120 and allows data to be efficiently transmitted.

The processor 1100 according to the present embodiment includes a plurality of core blocks 1110, and the plurality of core blocks 1110 may share the cache memory unit 1120. The plurality of core blocks 1110 and the cache memory unit 1120 are connected through the bus interface 1130. The plurality of core blocks 1110 may be configured in the same way as the aforementioned configuration of the core block 1110. In the case where the processor 1100 includes the plurality of core blocks 1110, the primary storage section 1121 of the cache memory unit 1120 may be configured in each core block 1110 in correspondence to the number of the plurality of core blocks 1110, and the secondary storage section 1122 and the tertiary storage section 1123 may be configured outside of the plurality of core blocks 1110 in such a way as to be shared through the bus interface 1130. The processing speed of the primary storage section 1121 may be faster than the processing speeds of the secondary and tertiary storage section 1122 and 1123.

The processor 1100 according to the present embodiment further includes an embedded memory unit 1140 that stores data, a communication module unit 1150 that transmits data to an external device and receives data from an external device in a wired manner or a wireless manner, a memory control unit 1160 that drives an external memory device, and a media processing unit 1170 that processes the data prepared in the processor 1100 or the data inputted from an external input device and outputs the processed data to an external interface device. Besides, the processor 1100 may include a plurality of modules. In this case, the plurality of modules that are added may exchange data with the core blocks 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and so on. In particular, the embedded memory unit 1140 may include the nonvolatile memory device according to the aforementioned embodiment as a nonvolatile memory.

The embedded memory unit 1140 including the semiconductor device in accordance with the aforementioned embodiment includes a first transistor having a fixed threshold voltage and a second transistor, which is coupled to the first transistor in parallel, having a variable threshold voltage. The first transistor and the second transistor may include a plurality of unit cells, which share a gate, a source, and a drain. The second transistor may be an SONOS type transistor having a memory layer. The memory layer may be a liner layer of an isolation structure that separates the plurality of unit cells. More specifically, the embedded memory unit 1140 may include an isolation trench, a charge trapping layer, a gap-fill insulating layer, a gate, a source and a drain. The isolation trench is formed on a substrate and defines an active region. The charge trapping layer is formed on a surface of the isolation trench. The gap-fill insulating layer fills a part of the isolation trench. The gate is formed on the substrate to fill a remaining isolation trench on the gap-fill insulating layer. The source and the drain are formed on the active region under both sides of the gate. The embedded memory unit 1140 may simplify a structure of the nonvolatile memory device and may increase the integration thereof by using the liner layer of the isolation structure as the memory layer. The embedded memory unit 1140 may prevent a characteristic deterioration caused by a memory layer forming process and improve the logic compatibility. Thus, the embedded memory unit 1140 and the processor 1100 having the same may be minimized and performed with a high performance.

The communication module unit 1150 may include both a module that may be connected with a wired network and a module that may be connected with a wireless network. The wired network module may include a local area network (LAN), a universal serial bus (USB), an Ethernet, power line communication (PLC), and so on. The wireless network module may include Infrared Data Association (IrDA), code division multiple access (CDMA), time division multiple access (TDMA) frequency division multiple access (FDMA) a wireless LAN, Zigbee, a ubiquitous sensor network (USN). Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and so on.

The memory control unit 1160 is to administrate data transmitted between the processor 1100 and an external storage device operating according to a different communication standard. The memory control unit 1160 may include various memory controllers, for example, controllers for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 processes the data processed in the processor 1100 and the data inputted from the external input device, and outputs the processed data to the external interface device to be transmitted in the forms of image, voice and others. The media processing unit 1170 may include a graphic processing unit (GPU), a digital signal processor (DSP), a high definition audio (HD audio), a high definition multimedia interface (HDMI) controller, and so on.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
    an isolation trench formed on a substrate and defining an active region;
    a charge trapping layer formed on a surface of the isolation trench;
    a gap-fill insulating layer partially filling the isolation trench on the charge trapping layer;
    a gate formed on the substrate and filling a remaining isolation trench on the gap-fill insulating layer; and
    a source and a drain formed on the active region under both sides of the gate.

2. The nonvolatile memory device of claim 1, further comprising:
    a tunnel insulating layer formed between the isolation trench and the charge trapping layer; and
    a charge blocking layer formed on the charge trapping layer and expanded to the active region.

3. The nonvolatile memory device of claim 1, further comprising:
    a gate insulating layer formed between the charge blocking layer and the active region.

4. The nonvolatile memory device of claim 3, wherein the charge trapping layer includes a nitride layer, and the tunnel insulating layer, the gate insulating layer and the charge blocking layer include an oxide layer.

5. The nonvolatile memory device of claim 1, further comprising:

a threshold voltage adjusting region formed on the active region between the source and drain.

6. The nonvolatile memory device of claim 5, wherein a bottom plane of the threshold voltage adjusting region is higher than a bottom plane of each of the source and the drain.

7. The nonvolatile memory device of claim 1, wherein the gap-fill insulating layer fills a lower region of the isolation trench and exposes the charge trapping layer of an upper region of the isolation trench.

8. The nonvolatile memory device of claim 1, wherein the upper plane of the gap-fill insulating layer has substantially the same height as or a lower height than that of a bottom plane of each of the source and the drain.

9. A nonvolatile memory device, comprising:
   an isolation trench formed on a substrate and defining an active region;
   a first conductive type isolated well formed on the substrate and corresponding to the active region;
   a memory layer formed on a surface of the isolation trench;
   a gap-fill insulating layer partially filling the isolation trench on the memory layer;
   a gate formed on the substrate and filling a remaining isolation trench on the gap-fill insulating layer;
   a second conductive type source and a second conductive type drain formed on the active region under both sides of the gate; and
   a first conductive type threshold voltage adjusting region formed on the active region between the second conductive type source and the second conductive type drain.

10. The nonvolatile memory device of claim 9, wherein the memory layer comprises:
    a tunnel insulating layer formed on the surface of the isolation trench;
    a charge trapping layer formed on the tunnel insulating layer; and
    a charge blocking layer formed on the charge trapping layer and expanded to the active region.

11. The nonvolatile memory device of claim 9, wherein a bottom plane of the first-conductive type threshold voltage adjusting region is higher than a bottom plane of each of the second conductive type source and the second conductive type drain.

12. The nonvolatile memory device of claim 9, wherein the upper plane of the gap-fill insulating layer has substantially the same height as or a lower height than that of a bottom plane of each of the second conductive type source and the second conductive type drain.

13. The nonvolatile memory device of claim 9, wherein in a programming operation of the nonvolatile memory device, a hot carrier injection (HCI) process or an FN tunneling process are used.

14. The nonvolatile memory device of claim 13, wherein in case that the HCI process is used in the programming operation, an impurity doping concentration of the first conductive type threshold voltage adjusting region is higher than an impurity doping concentration of the first conductive type isolated well.

15. The nonvolatile memory device of claim 9, wherein in an erase operation of the nonvolatile memory device, a bend-to-bend-tunneling (BTBT) process or an FN tunneling process is used.

16. The nonvolatile memory device of claim 15, wherein in case that the FN tunneling process is used in the erase operation, a second conductive type deep well is further formed under the first conductive type isolated well on the substrate.

* * * * *